United States Patent
Mignot et al.

(10) Patent No.: US 11,056,426 B2
(45) Date of Patent: Jul. 6, 2021

(54) METALLIZATION INTERCONNECT STRUCTURE FORMATION

(71) Applicant: International Business Machines Corporation, Armonk, NY (US)

(72) Inventors: Yann Mignot, Slingerlands, NY (US); Hosadurga Shobha, Niskayuna, NY (US); Hsueh-Chung Chen, Cohoes, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 16/425,524

(22) Filed: May 29, 2019

(65) Prior Publication Data

US 2020/0381354 A1 Dec. 3, 2020

(51) Int. Cl.
| | |
|---|---|
| *H01L 21/4763* | (2006.01) |
| *H01L 23/522* | (2006.01) |
| *H01L 21/768* | (2006.01) |
| *H01L 23/528* | (2006.01) |

(52) U.S. Cl.
CPC .... *H01L 23/5226* (2013.01); *H01L 21/76807* (2013.01); *H01L 21/76897* (2013.01); *H01L 23/528* (2013.01)

(58) Field of Classification Search
CPC ......... H01L 21/76807; H01L 21/76897; H01L 23/528; H01L 23/5226
USPC ....................................................... 438/629
See application file for complete search history.

(56) References Cited

U.S. PATENT DOCUMENTS

| | | | |
|---|---|---|---|
| 6,417,094 B1 | 7/2002 | Zhao et al. | |
| 6,867,073 B1 | 3/2005 | Enquist | |
| 8,114,769 B1 | 2/2012 | Srivastava et al. | |
| 8,399,180 B2* | 3/2013 | Farooq | H01L 21/3085 430/312 |
| 8,415,238 B2* | 4/2013 | Farooq | H01L 21/0337 438/525 |
| 8,563,403 B1 | 10/2013 | Farooq et al. | |
| 8,835,305 B2 | 9/2014 | Yang et al. | |

(Continued)

OTHER PUBLICATIONS

U.S. Appl. No. 16/104,403, filed in the name of Yongan Xu et al. on Aug. 17, 2018 and entitled "A Method of Forming a Straight Via Profile with Precise Critical Dimension Control.".

*Primary Examiner* — Luan C Thai
(74) *Attorney, Agent, or Firm* — L. Jeffrey Kelly; Ryan, Mason & Lewis, LLP

(57) ABSTRACT

Techniques for fabricating a metallic interconnect include forming a first metallization layer that includes a first dielectric layer, a first metallic layer formed in the first dielectric layer and a first capping layer formed on the first dielectric layer and the first metallic layer and forming a second metallization layer that includes a second dielectric layer, a second metallic layer formed in the second dielectric layer and a second capping layer formed on the second dielectric layer and the second metallic layer. A channel is etched in the second capping layer, second dielectric layer, and first capping layer that exposes a portion of the first metallic layer and a portion of the second metallic layer. A metallic interconnect structure is formed in the channel in contact with the exposed portion of the first metallic layer and the exposed portion of the second metallic layer.

20 Claims, 7 Drawing Sheets

(56) References Cited

U.S. PATENT DOCUMENTS

| | | |
|---|---|---|
| 9,202,941 B2 * | 12/2015 | Wakiyama ........ H01L 21/76898 |
| 9,385,078 B1 | 7/2016 | Feurprier et al. |
| 9,406,561 B2 | 8/2016 | Farooq et al. |
| 9,449,914 B2 * | 9/2016 | Ho .......................... H01L 24/02 |
| 9,466,563 B2 * | 10/2016 | Mignot ............. H01L 21/31111 |
| 9,543,257 B2 * | 1/2017 | Tsai ...................... H01L 23/481 |
| 9,613,862 B2 | 4/2017 | Lenhardt et al. |
| 9,633,917 B2 | 4/2017 | Tsai et al. |
| 9,691,659 B1 | 6/2017 | Mignot et al. |
| 9,786,557 B1 | 10/2017 | Chi et al. |
| 9,793,164 B2 | 10/2017 | Machkaoutsan et al. |
| 9,805,972 B1 | 10/2017 | Zhang et al. |
| 10,020,254 B1 | 7/2018 | Bao et al. |
| 10,121,754 B2 | 11/2018 | Oliver et al. |
| 10,181,420 B2 | 1/2019 | Stephens et al. |
| 2007/0134917 A1 | 6/2007 | Li et al. |
| 2010/0025853 A1 | 2/2010 | Lindgren et al. |
| 2010/0227471 A1 | 9/2010 | Leung et al. |
| 2015/0001735 A1 | 1/2015 | Mignot et al. |
| 2015/0243568 A1 | 8/2015 | Fischer et al. |
| 2016/0336225 A1 | 11/2016 | Chen et al. |
| 2017/0194248 A1 | 7/2017 | Das |
| 2018/0061700 A1 | 3/2018 | Sun et al. |
| 2018/0269150 A1 | 9/2018 | Lin et al. |

\* cited by examiner

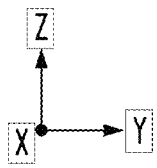
FIG. 1
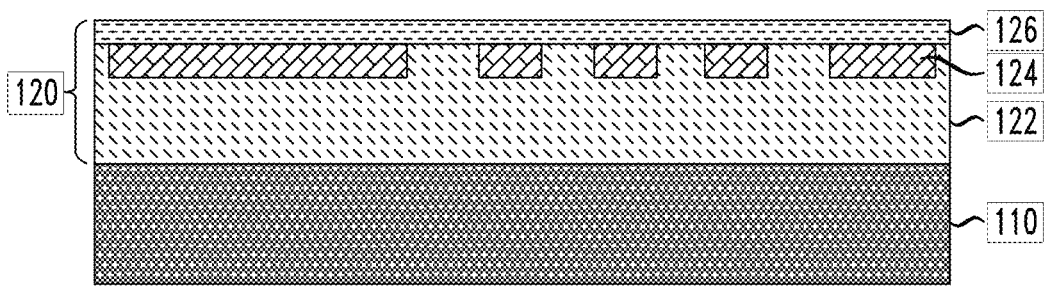
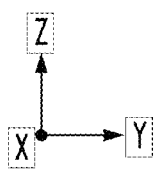
FIG. 2
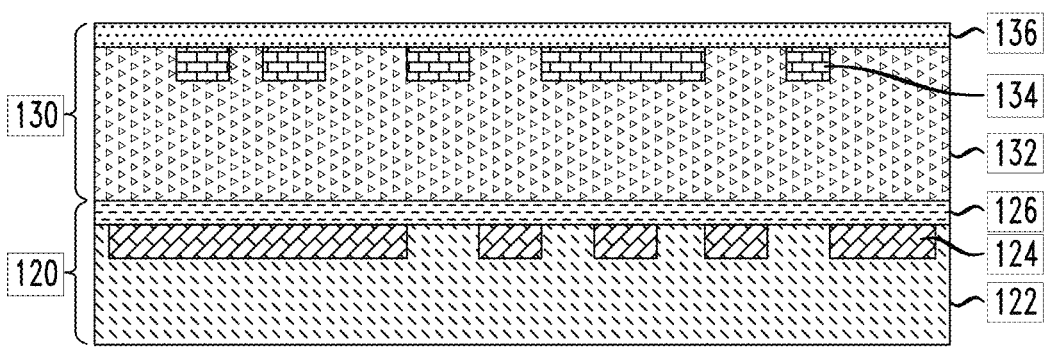

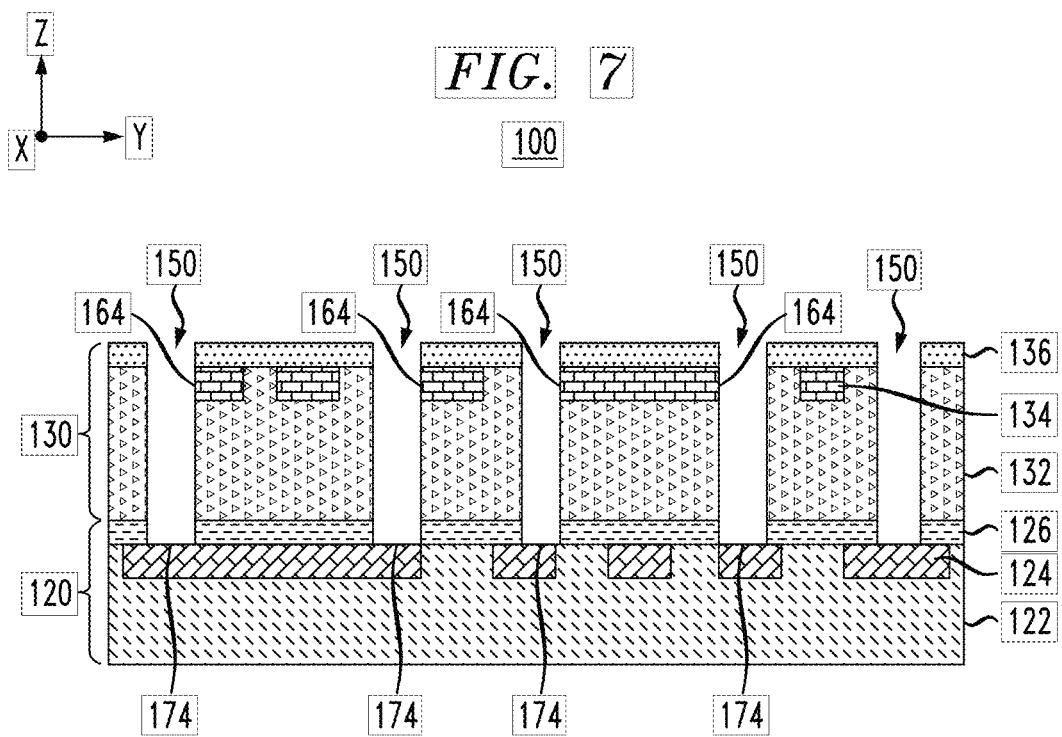
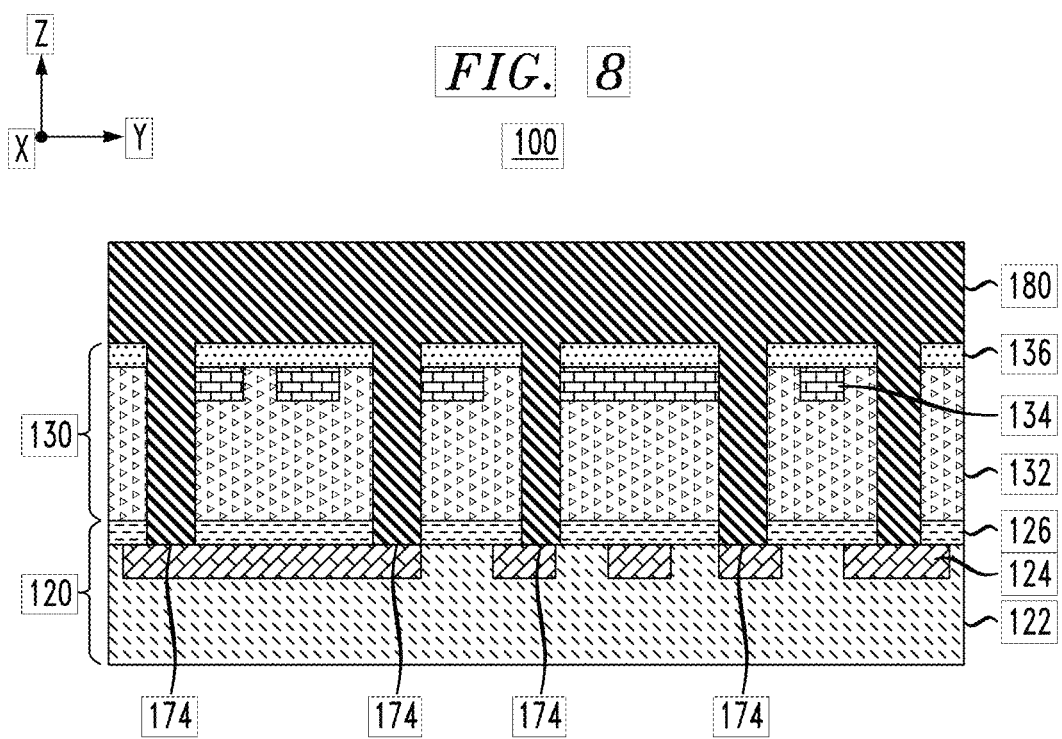

METALLIZATION INTERCONNECT STRUCTURE FORMATION

TECHNICAL FIELD

This disclosure generally relates to semiconductor fabrication techniques and, in particular, techniques for fabricating metallic interconnect structures.

BACKGROUND

A semiconductor integrated circuit chip is typically fabricated with a back-end-of-line (BEOL) interconnect structure, which comprises multiple levels of metal lines and inter-level metal vias, to connect various integrated circuit components and devices that are fabricated as part of a front-end-of-line (FEOL) layer of the semiconductor integrated circuit chip. Current state of the art BEOL process technologies typically implement a single damascene technique or dual damascene technique for forming the interconnect vias. In the single damascene technique, a first metal layer is formed followed by the formation of an interconnect via. A second metal layer is then formed on top of the interconnect via. In the double damascene technique, the first metal layer is formed followed by the formation of both the second metal layer and the interconnect via as part of the same metal deposition process. In both the single and double damascene techniques, the interconnect via profile and chamfer height may be difficult to control since they typically depend on the etch time if no stop layer is utilized.

SUMMARY

Embodiments of the invention include methods for fabricating metallization interconnect structures of a semiconductor device after formation of the metal layers to be interconnected.

For example, in one embodiment, a method for fabricating a metallic interconnect of a semiconductor device comprises forming a first metallization layer of the semiconductor device. The first metallization layer comprises a first dielectric layer, a first metallic layer formed in the first dielectric layer and a first capping layer formed on the first dielectric layer and the first metallic layer. The method further comprises forming a second metallization layer of the semiconductor device. The second metallization layer comprises a second dielectric layer, a second metallic layer formed in the second dielectric layer and a second capping layer formed on the second dielectric layer and the second metallic layer. The method further comprises etching a channel in the second capping layer, second dielectric layer, and first capping layer that exposes a portion of the first metallic layer and a portion of the second metallic layer and forming a metallic interconnect structure in the channel. The metallic interconnect structure is formed in contact with the exposed portion of the first metallic layer and the exposed portion of the second metallic layer.

In an embodiment, a semiconductor device is disclosed that comprises a first metallization layer comprising a first dielectric layer, a first metallic layer disposed in the first dielectric layer and a first capping layer disposed on the first dielectric layer and the first metallic layer. The semiconductor device further comprises a second metallization layer comprising a second dielectric layer, a second metallic layer disposed in the second dielectric layer and a second capping layer disposed on the second dielectric layer and the second metallic layer. The semiconductor device further comprises a metallic interconnect structure disposed in contact with a portion of the first metallic layer, a portion of the second metallic layer and a portion of the second capping layer.

In another embodiment, a method for fabricating a metallic interconnect of a semiconductor device is disclosed, the method comprising forming a middle-of-line (MOL) layer of the semiconductor device that comprises at least one metallic contact and a first capping layer formed over the at least one metallic contact. The method further comprises forming a metallization layer of the semiconductor device that comprises a dielectric layer, a metallic layer formed in the dielectric layer and a second capping layer formed on the dielectric layer and the metallic layer. The method further comprises etching a channel in the second capping layer, dielectric layer, and first capping layer that exposes a portion of the metallic contact and a portion of the metallic layer and forming a metallic interconnect structure in the channel in contact with the exposed portion of the metallic contact and the exposed portion of the metallic layer.

Other embodiments will be described in the following detailed description of embodiments, which is to be read in conjunction with the accompanying figures.

BRIEF DESCRIPTION OF THE DRAWINGS

FIG. 1 is a schematic cross-sectional side view of a semiconductor device at an intermediate stage of fabrication comprising one or more underlying layers of a semiconductor device and a first BEOL metallization layer formed on the one or more underlying layers according to an embodiment of the present disclosure.

FIG. 2 is a schematic cross-sectional side view of the semiconductor device of FIG. 1 after forming a second BEOL metallization layer on the first BEOL metallization layer according to an embodiment of the present disclosure.

FIG. 7 is a schematic cross-sectional side view of the semiconductor device of FIG. 6 after the removal of the OPL according to an embodiment of the present disclosure.

FIG. 8 is a schematic cross-sectional side view of the semiconductor device of FIG. 7 after metallization of the channels according to an embodiment of the present disclosure.

DETAILED DESCRIPTION

Figure 3:
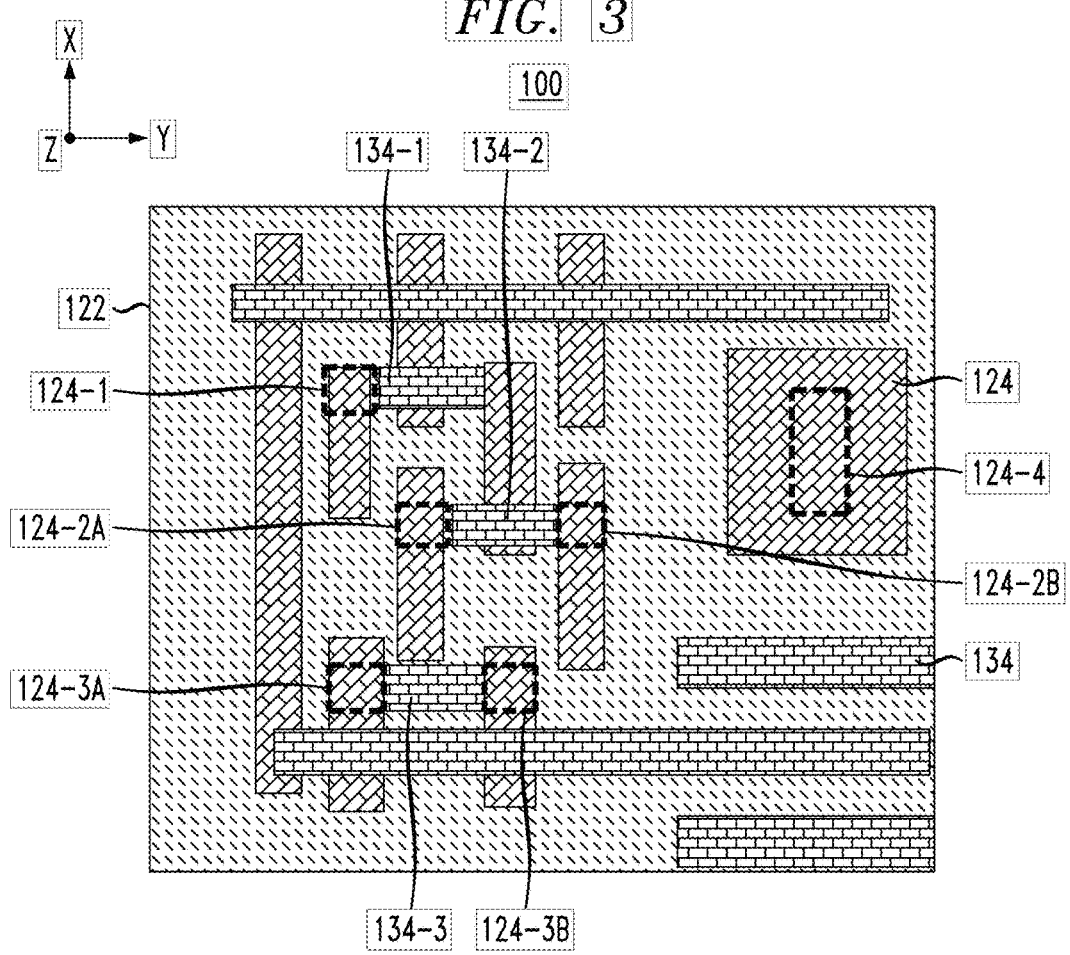
FIG. 3 is a top down view of the first and second BEOL metallization layers of FIG. 2, with some features removed for ease of illustration, according to an embodiment of the present disclosure.

Embodiments will now be described in further detail with regard to methods for fabricating BEOL metallization interconnect structures of a semiconductor device after formation of the metal layers to be interconnected. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

FIGS. 1-11 schematically illustrate a method for fabricating BEOL metallization interconnect structures of a semiconductor device after formation of the metal layers to be interconnected, according to an embodiment of the invention. The disclosed techniques inhibit the formation of a chamfer in the interconnect structures as is common with the single or double damascene techniques. In addition, the disclosed techniques improve the minimum spacing and the layout mask design by reducing the line length design openings in the dense features. The disclosed techniques also provide more flexibility in the metal mix that may be utilized for interconnect structures to improve Resistance/Capacitance (R/C). The disclosed techniques also do not require the use of a wet TiN removal of the capping layer where the interconnect structure contacts the underlying metallic layer, which reduces potential galvanic corrosion of the underlying metallic layer.

To begin, FIG. 1 is a schematic cross-sectional side view of a semiconductor device 100 at an intermediate stage of fabrication comprising one or more underlying layers 110 and a BEOL metallization ($M_X$) layer 120, where the X in $M_X$ represents a given BEOL metallization layer such as, e.g., the first metallization ($M_1$) layer, second metallization ($M_2$) layer or any other BEOL metallization layer.

In illustrative embodiments, the underlying layers 110 may comprise, for example, a semiconductor substrate (e.g., semiconductor wafer), a FEOL (front-end-of-line)/MOL (middle-of-line) structure formed on the semiconductor substrate, a capping layer formed on the FEOL/MOL structure and any other intervening layers between the capping layer and the $M_X$ layer 120. In some embodiments, for example, the $M_X$ layer 120 may be disposed on the capping layer of the one or more underlying layers 110. In other embodiments, for example, where the $M_X$ layer 120 is the $M_2$ layer or a later BEOL metallization layer, the one or more underlying layers 110 may also comprise one or more of the BEOL metallization layers that are disposed between the $M_X$ layer and the capping layer of the one or more underlying layers 110. While the one or more underlying layers 110 are illustrated as a generic layer, it is to be understood that the one or more underlying layers 110 may comprise one of different types of semiconductor substrate structures, FEOL structures, MOL structures, capping layers, BEOL structures and their respective materials.

For example, in one embodiment, the semiconductor substrate of the one or more underlying layers 110 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL. It is to be noted that in each drawing, the X-Y plane represents a plane that is parallel to the plane of the semiconductor substrate (e.g., wafer) being processed while the Z direction represents a direction perpendicular to the plane of the semiconductor substrate being processed. In some embodiments, the Z direction may also be referred to herein as the stacking direction of the semiconductor substrate.

The FEOL/MOL structure of the one or more underlying layers 110 comprises a FEOL layer formed on the semiconductor substrate. The FEOL layer comprises various semiconductor devices and components that are formed in or on the active surface of the semiconductor substrate to provide integrated circuitry for a target application. For example, the FEOL layer comprises field-effect transistor (FET) devices (such as FinFET devices, vertical FET devices, planar FET device, etc.), bipolar transistors, diodes, capacitors, inductors, resistors, isolation devices, etc., which are formed in or on the active surface of the semiconductor substrate 110. In general, FEOL processes typically include preparing the semiconductor substrate (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a $M_1$ layer of a BEOL structure that is formed on the FEOL/MOL structure.

The capping layer of the one or more underlying layers 110 comprises a layer of insulating/dielectric material such as silicon nitride (SiN), silicon carbide (SiC), silicon carbon nitride (SiCN), hydrogenated silicon carbide (SiCH), or a multilayer stack comprising the same or different types of dielectric materials, etc., or other suitable low-k dielectric materials which are non-reactive with the metallic material that is used to form metallic interconnect structures in the BEOL. In one example embodiment, the capping layer is formed with a thickness in a range of about 2 nm to about 60 nm.

In one embodiment, where the one or more underlying layers 110 comprise the $M_1$ layer, a dielectric layer is formed as part of an initial phase of a BEOL process module for forming the $M_1$ layer of a BEOL interconnect structure.

The dielectric layer for the $M_1$ layer is formed of any suitable dielectric material that is commonly utilized as an interlevel-dielectric (ILD) layer for BEOL process technologies. For example, the dielectric layer can be formed of a dielectric material including, but not limited to, silicon oxide (SiO2), silicon nitride (e.g., (Si3N4), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5). The thickness of the dielectric layer defines a vertical height (or thickness) of the metallization that is formed within the dielectric layer, which will vary depending on the application. For example, in one embodiment, the dielectric layer is formed with a thickness in a range of about 20 nm to about 800 nm. The capping layer and the dielectric layer are formed using known deposition techniques, such as, for example, ALD (atomic layer deposition), CVD, PECVD (plasma-enhanced CVD), or PVD, or spin-on deposition.

In some embodiments, for example, the dielectric layer is patterned to form an opening (e.g., trench opening or via opening) in the dielectric layer. The opening comprises a width in a range of about 10 nm to about 30 nm, and a height in a range of about 30 nm to about 100 nm, which is defined by the thickness of the dielectric layer. In some embodiments, the opening comprises an aspect ratio (H:W) of about 3:1 or greater.

In some embodiments, the metallic interconnect between the $M_1$ layer and the capping layer of the one or more underlying layers 110 may be formed using a single damascene process in which metallic interconnect structures, e.g., metallic lines (wiring) and metallic vias (vertical interconnects) are separately formed in different insulating layers of a BEOL structure. In other embodiments, openings can be etched in the sacrificial dielectric layer and filled with metallic material using one of various "dual" damascene patterning techniques known in the art in which trenches and via openings are patterned in the same dielectric layer and concurrently filled with metallic material. The dual damascene patterning methods include a "via first" process, a "trench first" process, and a "buried via" process, each of which comprising different sequences for etching the dielectric layer to pattern the via openings and trench openings, while concurrently filling the via openings and trench openings with metallic material.

The damascene patterning of the sacrificial dielectric layer can be implemented using any conventional photolithography and etching process, e.g., forming a photoresist mask on the upper surface of the sacrificial dielectric layer which comprises an image of the opening to be etched into the dielectric layer, followed by etching the dielectric layer using a dry etch process such as RIE (reactive ion etching), which has an etch chemistry that is suitable to etch the dielectric layer selective to the underlying capping layer (which serves as an etch stop layer). The capping layer insulates the metallization from the underlying PMD layer of the FEOL/MOL layer. However, in target locations where the metallization formed in the opening will make contact to vertical contacts formed in the underlying FEOL/MOL layer, the capping layer can be patterned by etching openings through the capping layer at the bottom of the opening at such target locations. The $M_1$ layer is then completed by forming another capping layer over the metallic and dielectric layers of the $M_1$ layer.

With reference again to FIG. 1, the MX layer 120 comprises a dielectric layer 122, a metallic layer 124, and a capping layer 126. In some embodiments, the MX layer may comprise the M2 layer, M3 layer, or any other layer. In some embodiments, the MX layer may comprise the M1 layer where, for example, some or all of the above techniques may be used to form the MX layer. Although not shown in FIG. 1, in some embodiments, the MX layer 120 comprises one or more metallic interconnects connecting the metallic layer 124 to one or more of the underlying layers 110, for example, using the single or double damascene techniques described above.

In illustrative embodiments, dielectric layer 122, metallic layer 124, and capping layer 126 of the $M_X$ layer 120 are formed using similar processes as those described above with respect the dielectric layer, metallic layer and capping layer of the $M_1$ layer. For example, the $M_X$ layer 120 may be formed on top of a capping layer that caps the one or more underlying layers 110. In some embodiments, the $M_X$ layer is the $M_1$ layer.

In illustrative embodiments, with reference now to FIG. 2, an $M_{X+1}$ layer 130 is formed on the $M_X$ layer 120. For ease of illustration, the one or more underlying layers 110 are not shown in FIGS. 2-11. $M_{X+1}$ layer 130 comprises a dielectric layer 132, a metallic layer 134, and a capping layer 136. In illustrative embodiments, dielectric layer 132, metallic layer 134, and capping layer 136 of the $M_{X+1}$ layer 130 are formed using similar processes as those described above with respect the dielectric layer, metallic layer and capping layer of the $M_1$ layer. In illustrative embodiments, the metallic interconnect structures for interconnecting the metallic layer 124 of $M_X$ layer 120 and the metallic layer 134 of $M_{X+1}$ layer 130 are not formed prior to or in conjunction with the formation of the metallic layer 134 of the $M_{X+1}$ layer 130 in contrast with the single damascene and double damascene techniques described above.

FIG. 3 illustrates a top down view of the $M_X$ layer 120 and the $M_{X+1}$ layer 130 of FIG. 2, with some features removed for ease of illustration. In particular, FIG. 3 illustrates the relative positions of the metallic layer 124 and metallic layer 134 with the dielectric layer 122 shown for illustrative purposes as a background. As can be seen in FIG. 3, in illustrative embodiments, portions 134-1, 134-2 and 134-3 of metallic layer 134 have a reduced length relative to conventional designs such that they do not directly overlap corresponding portions 124-1, 124-2A, 124-2B, 124-3A and 124-3B of the metallic layer 124, illustrated by dashed lines, over which the metallic interconnect structures will be formed. For example, when a single or double damascene technique is utilized, adjacent metallic layers will have overlapping portions between which the metallic interconnect structures extend to form the electrical connections. In illustrative embodiments, the next layer, e.g., the $M_{X+1}$ layer 130 in this case, does not overlap with the underlying $M_X$ layer in the locations where the metallic interconnect structures will extend between the metallic layers as will be described in more detail below. FIG. 3 also illustrates a portion 124-4 over which a metallic interconnect structure will extend that will not contact metallic layer 134. For example, the metallic interconnect structure that will be formed at portion 124-4 may be used to connect the metallic layer 124 of the $M_X$ layer 120 with an $M_{X+2}$ or other layer that will be formed over the $M_{X+1}$ layer at a later time, as shown, for example, in FIG. 12 where $M_{X+2}$ layer 140 is formed over the $M_{X+1}$ layer 130 and the metallic interconnect 182-4 connects the portion 124-4 of the metallic layer 124 to a portion 144-4 of a metallic layer 144 of the $M_{X+2}$ layer 140.

The fabrication of the metallic interconnect structures for electrically connecting portions of metallic layer 124 with portions of metallic layer 134 according to illustrative embodiments will now be described in more detail with reference to FIGS. 4-11.

Figure 4:
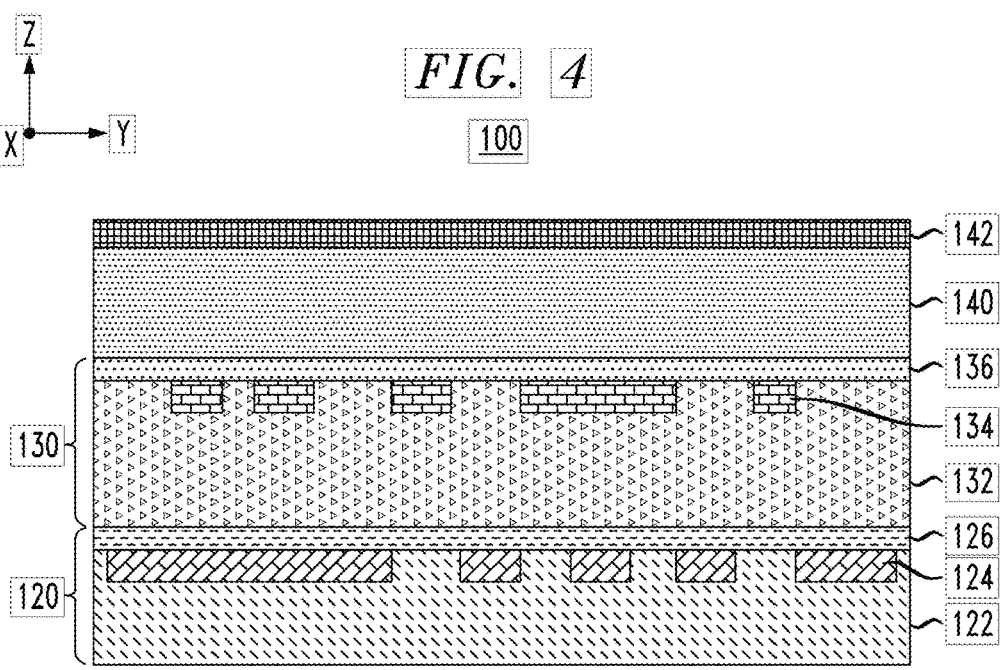
FIG. 4 is a schematic cross-sectional side view of the semiconductor device of FIG. 2 after an organic planarizing layer (OPL) and a hard mask layer have been formed on a capping layer of the second BEOL metallization layer according to an embodiment of the present disclosure.

FIG. 4 is a schematic cross-sectional side view of the semiconductor device 100 after an organic planarizing layer (OPL) 140 and a hard mask layer 142 have been formed on the capping layer 136 of the $M_{X+1}$ layer 130. In one embodiment, the hard mask layer 142 comprises an anti-reflection coating (ARC) layer formed of amorphous silicon (e.g., a Si-ARC layer).

The OPL 140 is formed over the capping layer 136 using known organic materials and techniques. For example, the OPL 140 may comprise a resist or organic material that is applied by spin coating and baked to enhance planarization. The OPL 140 may comprise a liquid monomer that is applied by spin coating and photochemically hardened. In some embodiments, the OPL 140 is formed to a thickness of approximately 60 nm to 200 nm, although these and other dimensions are presented herein as illustrative examples and should not be construed as limiting.

The hard mask layer 142 is formed over the OPL 140. In some embodiments, the hard mask layer 142 serves as an ARC (anti reflection coating) layer. In some embodiments, the hard mask layer 142 may be formed, for example, using atomic layer deposition, plasma assisted deposition, spin on coat, or using other similar processes. Hard mask layer 142 may be formed of silicon-based materials such as silicon oxide, silicon nitride or silicon oxynitride, although a wide variety of other inorganic or organic materials could be used. Additional examples of inorganic materials that may be used to form the hard mask layer 142 include metal-containing materials such as, e.g., titanium-oxide (TiO) materials or titanium-nitride (TiN) materials. Numerous other metal oxides, metal nitrides and/or metal oxynitrides, as well as other types of metal-containing materials, could be used. The hard mask layer 142 may have a thickness in the range of about 3 nm to about 15 nm.

Figure 5:
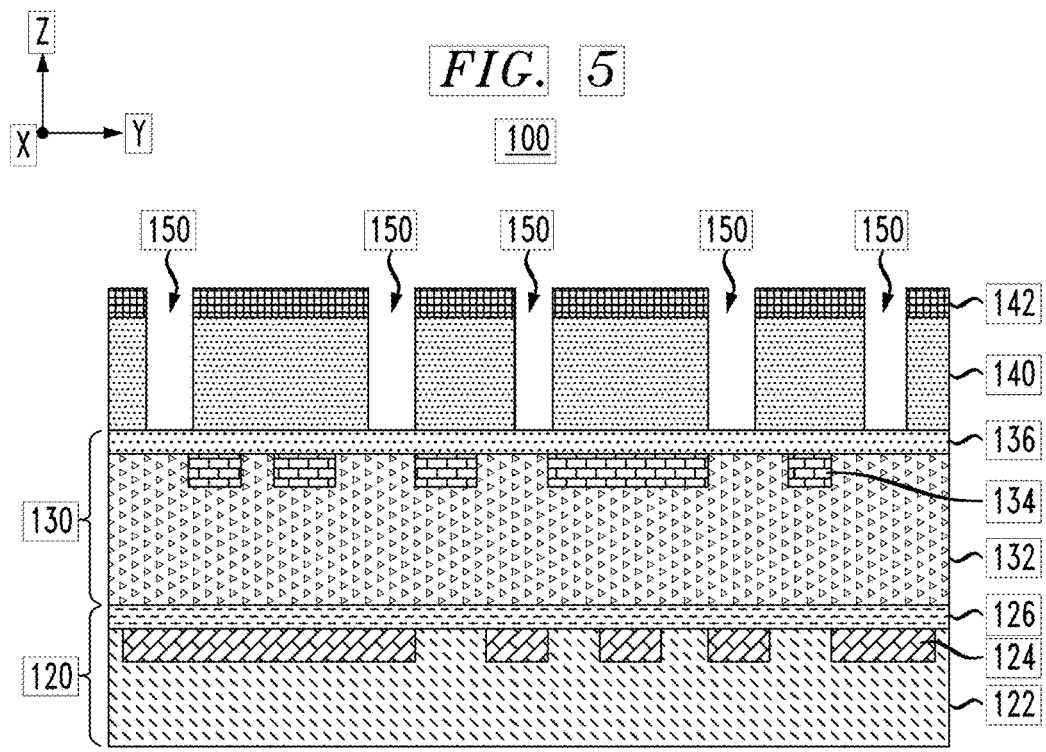
FIG. 5 is a schematic cross-sectional side view of the semiconductor device of FIG. 4 after a pattern is etched into the OPL and hard mask layer to form channels according to an embodiment of the present disclosure.

FIG. 5 is a schematic cross-sectional side view of the semiconductor device 100 after a pattern is etched into the OPL 140 and hard mask layer 142 to form channels 150. In some embodiments, for example, the channels 150 may be formed using available lithographic techniques and etched into the hard mask layer 142 selective of the OPL 140. For example, a lithographic resist mask may be formed on the upper surface of the hard mask layer 142 which comprises an image of the pattern to be etched into the hard mask layer 142, followed by etching the hard mask layer using a dry etch process such as RIE (reactive ion etching), which has an etch chemistry that is suitable to etch the hard mask layer 142 selective to the underlying OPL layer 140 (which serves as an etch stop layer). In illustrative embodiments, for example, the hard mask layer 142 may be etched selective to the OPL 140 according to the pattern using a fluorine-based reactive ion etch (RIE), e.g., using tetrafluoromethane ($CF_4$) or fluoromethane ($CH_3F$)/$CF_4$, or other fluorine-based chemistry, and the lithographic resist mask may be removed.

The pattern may then be transferred to the OPL 140 by applying one or more processes to form channels 150 in the OPL 140. In some embodiments, for example, OPL 140 may be etched using a dry etch process such as, e.g., RIE, having an etch chemistry which is configured to etch the material of the OPL 140 selective to the materials of the hard mask layer 142 and capping layer 136. In some embodiments, the processes used to pattern the OPL 140 may also remove the lithographic resist mask. In some embodiments, example etch chemistries for etching OPL 140 selective to hard mask layer 142 and capping layer 136 may comprise a nitrogen-based chemistry (e.g., $N_2$)/a hydrogen-based chemistry (e.g., $H_2$), a helium-based chemistry (He), a carbon-oxide based chemistry (e.g., $CO$/$CO_2$), and a sulfur-oxygen based chemistry (e.g., sulfur dioxide ($SO_2$)) or combinations thereof. In some embodiments, example etch chemistries for etching OPL 140 may comprise a hydrogen-bromide based chemistry (e.g., HBr)/oxygen-based chemistry (e.g., $O_2$), or combinations thereof. In some embodiments, example etch chemistries for etching OPL 140 may comprise a sulfur-oxygen based chemistry (e.g., $SO_2$)/oxygen-based chemistry (e.g., $O_2$), or combinations thereof.

It is important to note that in illustrative embodiments, the pattern of one or more of channels 150 overlap one or more of portions 124-1, 124-2A, 124-2B, 124-3A, 124-3B and 124-4 of metallic layer 124 over which the metallic interconnect structures will be formed but do not overlap with the portions 134-1, 134-2, and 134-3 of metallic layer 134. In some embodiments, a channel 150 may not overlap a portion of metallic layer 124 where, for example, the channel 150 corresponds to a metallic interconnect structure that will provide an electrical connection to one of the one or more underlying layers 110 without being in contact to metallic layer 124.

Figure 6:
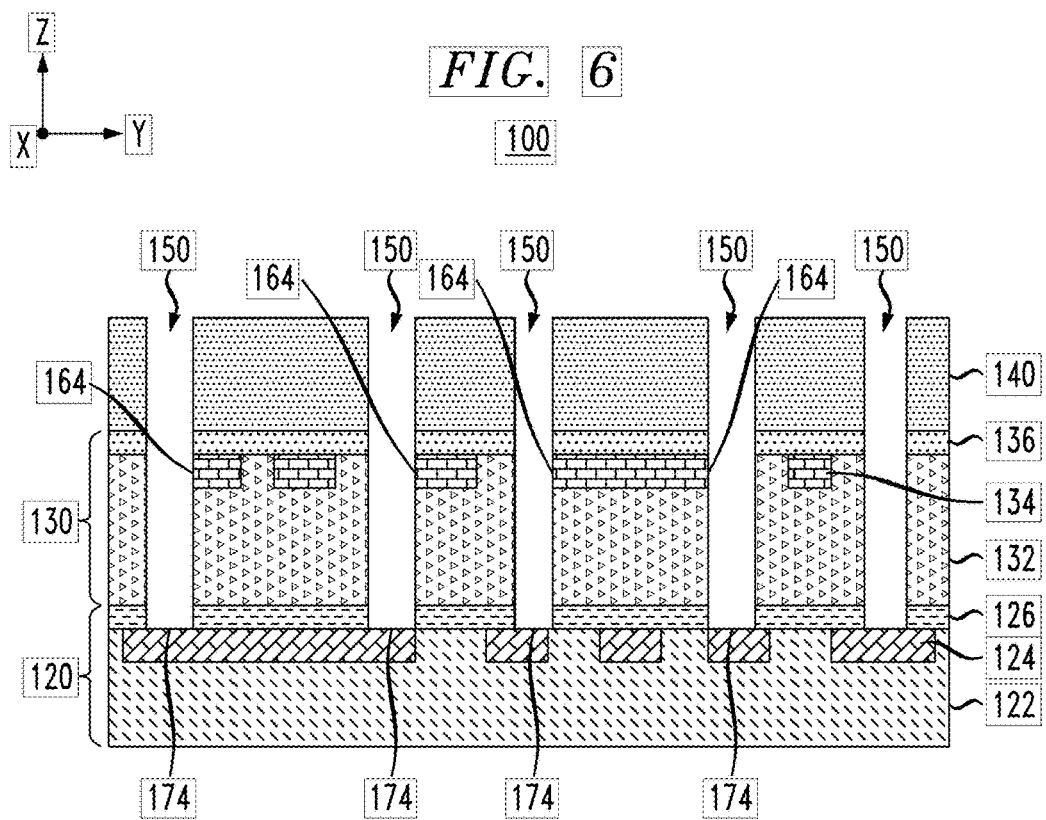
FIG. 6 is a schematic cross-sectional side view of the semiconductor device of FIG. 5 after the pattern of channels is transferred to the capping layer and dielectric layer of the second BEOL metallization layer and the capping layer of the first BEOL metallization layer according to an embodiment of the present disclosure.

FIG. 6 is a schematic cross-sectional side view of the semiconductor device 100 after the pattern of channels 150 is transferred to the capping layer 136 and dielectric layer 132 of the $M_{X+1}$ layer 130 and capping layer 126 of the $M_X$ layer 120. For example, the capping layers 126 and 136 and the dielectric layer 132 may be etched selective to metallic layer 124 using, for example, one or more dry etch processes such as ME, which have an etch chemistry that is suitable to etch the capping layers 126 and 136 and dielectric layer 132 selective to the underlying metallic layer 124 (which serves as an etch stop layer). In some embodiments, hard mask layer 142 may be removed during one or more of the etching processes to etch the pattern into the capping layers 126 and 136 and dielectric layer 134. In some embodiments, hard mask layer 142 may be removed by a separate burnoff process.

In some embodiments, the etching of one or more of capping layer 126, dielectric layer 132 and capping layer 136 may be performed as separate etching processes that are selective relative to each other. For example, in some embodiments, capping layer 136 may be etched selective to dielectric layer 132 to transfer the pattern to capping layer 136 followed by an etching of dielectric layer 132 selective to capping layer 136 and capping layer 126 to transfer the pattern to dielectric layer 132. The pattern may then be transferred to capping layer 126 by an etching process that is selective to dielectric layer 132 and metallic layer 124. The etching of the capping layers 126 and 136 and dielectric layer 132 extends the channels 150 to the metallic layer 124.

As can be seen in FIG. 6, in illustrative embodiments, channels 150 extend through the MX+1 layer to the metallic layer 124 of the MX layer 120. In illustrative embodiments, side portions 164 of metallic layer 134 are exposed in the adjacent channels 150 such that when the channels 150 are filled with metallic material, the metallic material will be in contact with the exposed side portions 164 and corresponding portions 174 of metallic layer 124 to electrically connect the side portions 164 of the metallic layer 134 to the corresponding portions 174 of metallic layer 124. It is important to note that the etching to transfer the pattern of channels 150 through the MX+1 layer 130 to the metallic layer 124 does not etch metallic layer 134 but rather etches next to the portions 164 of metallic layer 134 to expose the side portions 164. This is made possible by the reduced length of the portions of metallic layer 134. It is important to note that the right most channel 150 does not expose a portion of metallic layer 134 and may be used to interconnect the metallic layer 124 with a metallic layer of another metallization layer such as, e.g., a metallic layer of an MX+2 layer (not shown) that is later formed on the MX+1 layer 130.

FIG. 7 is a schematic cross-sectional side view of the semiconductor device 100 after the removal of the OPL 140. In some embodiments, for example, the remaining portions of OPL 140 may be removed using oxygen-based chemistry, for example, using an $O_2$ gas. In some embodiments, the remaining portions of OPL 140 may be removed using any of the etch chemistries described above for patterning OPL 140.

FIG. 8 is a schematic cross-sectional side view of the semiconductor device 100 after metallization of the channels 150, for example, by deposition of a metallic material 180. In illustrative embodiments, for example, metallic material 180 may be deposited on the semiconductor device 100 and in the channels 150 using known deposition techniques, such as, for example, ALD (atomic layer deposition), CVD, PECVD (plasma-enhanced CVD), PVD, spin-on deposition, electroplating or other techniques. As seen in FIG. 8, metallic material 180 is deposited in contact with the portions 174 of metallic layer 124. In some embodiments, metallic material 180 may comprise the same material as metallic layers 124 and 134 or may comprise a different material than metallic layers 124 and 134. For example, in some embodiments, the material that is used for metallic material 180 may be chosen according to desired device performance characteristics of the semiconductor device. In some embodiments, a pre-metallization liner may be used in the channels 150 to prevent metal migration of the metallic material 180 into the dielectric 132. For example, in some embodiments, a pre-metallization liner may be utilized when the metallic material comprises a copper-based material.

Figure 9:
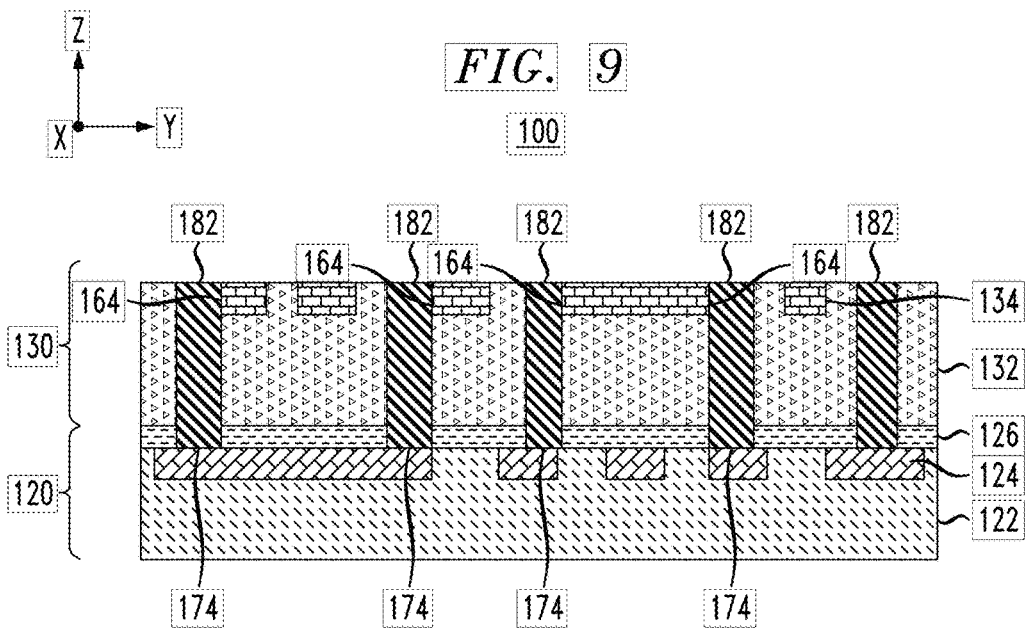
FIG. 9 is a schematic cross-sectional side view of the semiconductor device of FIG. 8 after a standard planarization process has been used to remove the overburden metallic material and to planarize the semiconductor structure down to a target level to form metallic interconnect structures according to an embodiment of the present disclosure.

FIG. 9 is a schematic cross-sectional side view of the semiconductor device 100 after a standard planarization process such as chemical-mechanical polishing (CMP) has been used to remove the overburden metallic material 180 and to planarize the semiconductor structure down to a target level, e.g., an upper surface of metallic layer 134. For example, as seen in FIG. 9, the overburden metallic material 180 has been planarized to form interconnect structures 182 that extend from the portions 174 of metallic layer 124 up to the level of the upper surface of metallic layer 134. In addition, as illustrated in FIG. 9, with the exception of the right most interconnect structure 182, the illustrated interconnect structures 182 also are in contact with the portions 164 of the metallic layer 134 that were exposed in the channels 150.

Figure 10:
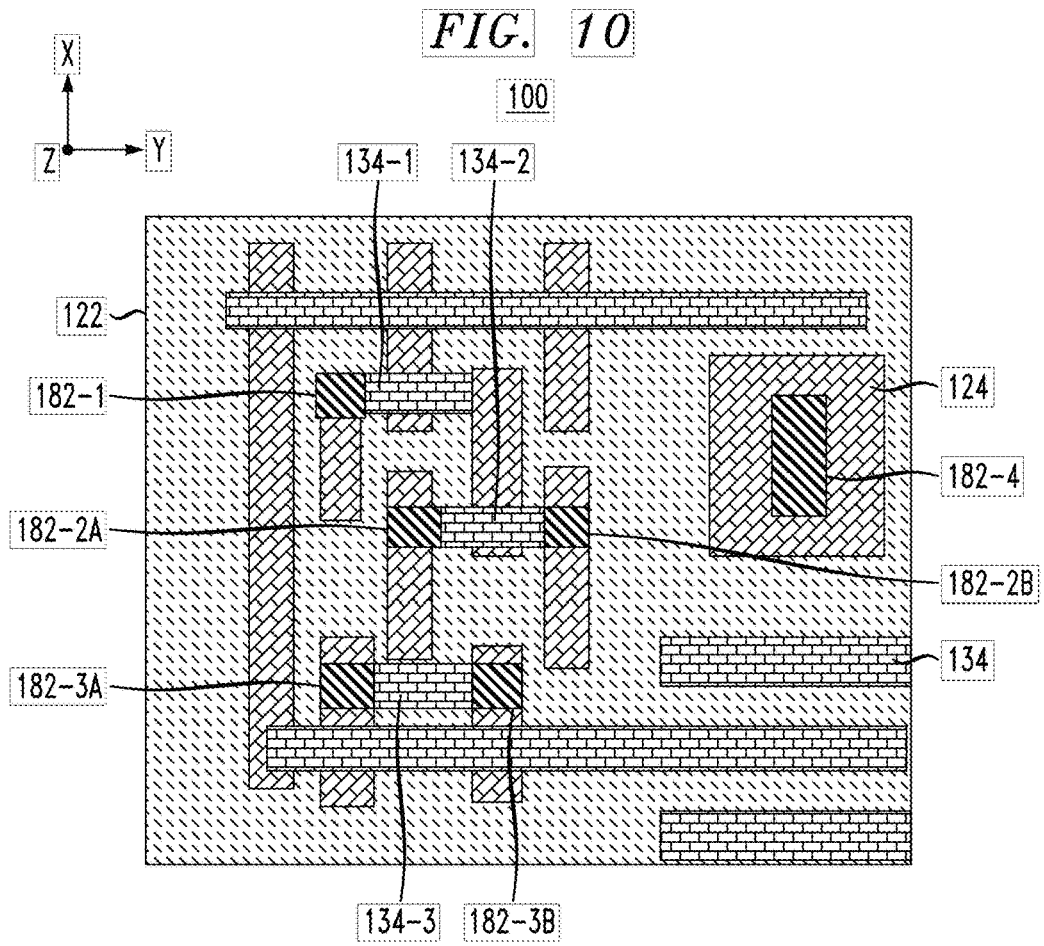
FIG. 10 is a top down view of the first and second BEOL metallization layers and the metallic interconnect structures of FIG. 9, with some features removed for ease of illustration, according to an embodiment of the present disclosure.

FIG. 10 illustrates a top down view of the $M_X$ layer 120 and the $M_{X+1}$ layer 130 of FIG. 9, with some features removed for ease of illustration. In particular, FIG. 10 illustrates the relative positions of the metallic layer 124, metallic layer 134, and interconnect structures 182 with the dielectric layer 122 shown for illustrative purposes as a background. As can be seen in FIG. 10, in illustrative embodiments, the sides of portions 134-1, 134-2 and 134-3 of metallic layer 134 are in contact with respective interconnect structures 182-1, 182-2A, 182-2B, 182-3A and 182-3B where the interconnect structures 182-1, 182-2A, 182-2B, 182-3A and 182-3B have been formed to overlap with the corresponding portions 124-1, 124-2A, 124-2B, 124-3A and 124-3B of the metallic layer 124 shown in FIG. 3. FIG. 10 also illustrates an interconnect structure 182-4 that is formed over the corresponding portion 124-4 (FIG. 4) of metallic layer 124 and does not contact metallic layer 134.

Figure 11:
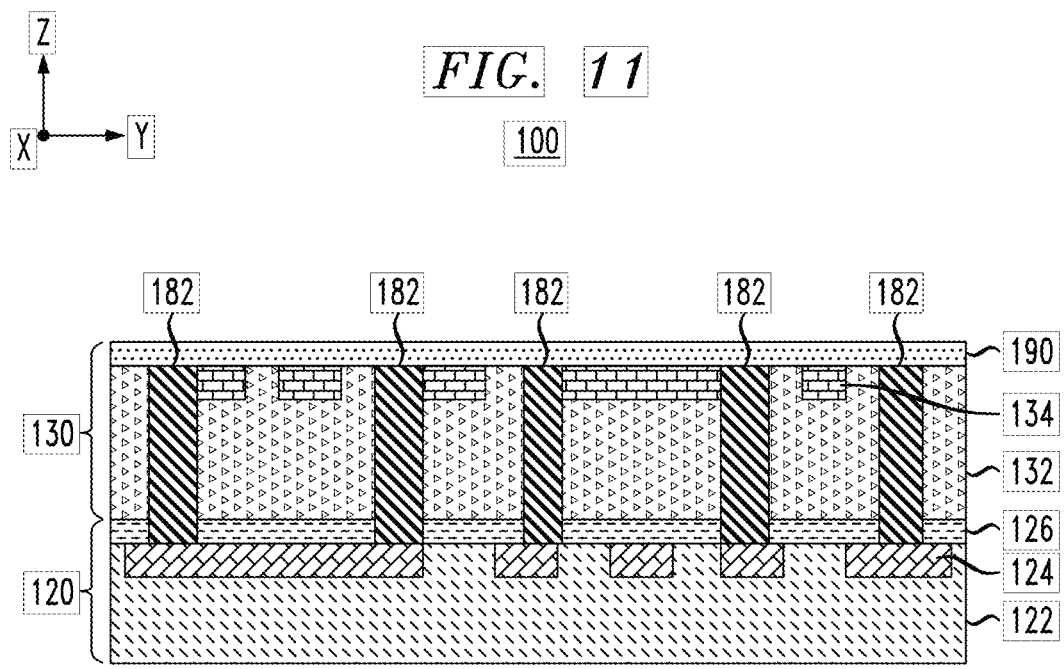
FIG. 11 is a schematic cross-sectional side view of the semiconductor device of FIG. 9 after the formation of a new capping layer for the second BEOL metallization layer on the dielectric layer, metallic layer and interconnect structures according to an embodiment of the present disclosure.

FIG. 11 is a schematic cross-sectional side view of the semiconductor device 100 after the formation of a new capping layer 190 for the $M_{X+1}$ layer 130 on the dielectric layer 132, metallic layer 134 and interconnect structures 182, for example, using the techniques described above for forming capping layers 136 and 126.

Figure 12:
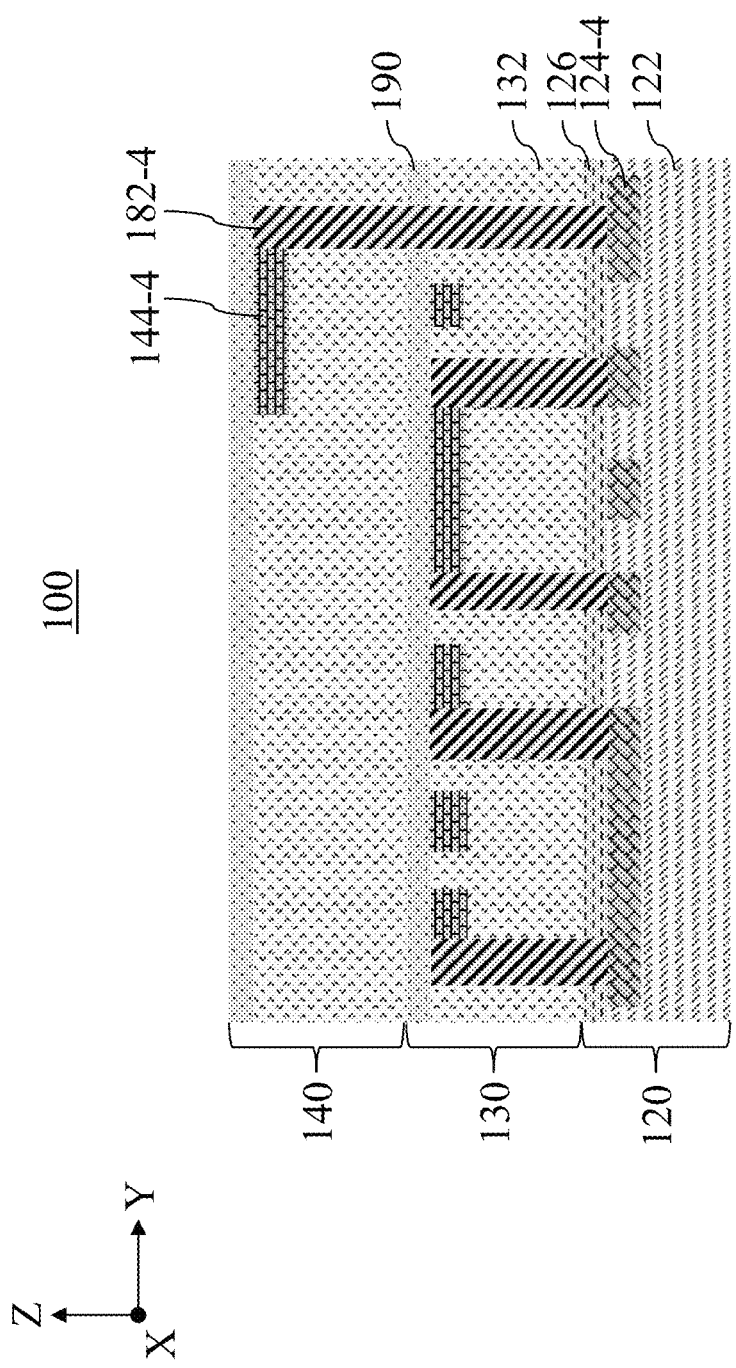
FIG. 12 is a schematic cross-sectional side view of the semiconductor device of FIG. 11 after the formation of a third BEOL metallization layer on the second BEOL metallization layer according to an embodiment of the present disclosure.

In illustrative embodiments, one or more additional metallization layers, e.g., an $M_{X+2}$ layer, an $M_{X+3}$ layer ... $M_{X+N}$ layer, and corresponding interconnect structures may be formed in a similar manner to that described above for the $M_X$ and $M_{X+1}$ layers. For example, as shown in FIG. 12, an $M_{X+2}$ layer 140 may be formed over the $M_{X+1}$ layer 130 in a similar manner to that described above for forming the $M_{X+1}$ layer 130 over the $M_X$ layer 120.

While the interconnect structures between the $M_1$ layer and the underlying MOL layer are described above as being formed using the single or double damascene techniques, in some embodiments, the interconnect structures between the $M_1$ and underlying MOL layer may alternatively be formed using the technique described in the illustrative embodiments with reference to FIGS. 4-11 above, e.g., forming the interconnect structures after formation of the metallic layers to be electrically connected. For example, in illustrative embodiments, the $M_X$ layer 120 described above may represent the MOL layer of the one or more underlying layers 110 and the $M_{X+1}$ layer 130 may correspond to the $M_1$ layer wherein, for example, interconnect structures between the $M_1$ layer and the contacts of the MOL layer may be formed after formation of the $M_1$ layer, e.g., using the above described techniques.

It is to be understood that the methods discussed herein for fabricating metallic interconnect structures (e.g., copper BEOL interconnect structures) after formation of the metallic layers to be electrically connected can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method for fabricating a metallic interconnect of a semiconductor device, comprising:
    forming a first metallization layer of the semiconductor device, the first metallization layer comprising a first dielectric layer, a first metallic layer formed in the first dielectric layer and a first capping layer formed on the first dielectric layer and the first metallic layer;
    forming a second metallization layer of the semiconductor device, the second metallization layer comprising a second dielectric layer, a second metallic layer formed in the second dielectric layer and a second capping layer formed on the second dielectric layer and the second metallic layer;
    etching a channel in the second capping layer, second dielectric layer, and first capping layer, the channel exposing a portion of the first metallic layer and a portion of the second metallic layer;
    forming a metallic interconnect structure in the channel, the metallic interconnect structure being formed in contact with the exposed portion of the first metallic layer and the exposed portion of the second metallic layer;
    planarizing the metallic interconnect structure and the second capping layer to a surface of the second metallic layer, the planarizing removing the second capping layer; and
    forming a third capping layer over the second dielectric layer, second metallic layer, and metallic interconnect structure.

2. The method of claim 1, wherein the metallic interconnect structure extends from the portion of the first metallic layer to the third capping layer.

3. The method of claim 1, further comprising:
    etching a second channel in the second capping layer, second dielectric layer, and first capping layer, the second channel exposing a second portion of the first metallic layer and being spaced apart from the second metallic layer by at least a portion of the second dielectric layer; and
    forming a second metallic interconnect structure in the second channel, the second metallic interconnect structure being formed in contact with the second portion of the first metallic layer.

4. The method of claim 3, wherein the second metallic interconnect structure extends from the second portion of the first metallic layer to the third capping layer.

5. The method of claim 4, wherein the second metallic interconnect structure is configured to electrically connect the first metallic layer with a third metallic layer of a third metallization layer formed on the second metallization layer.

6. The method of claim 1, wherein the portion of the second metallic layer that is in contact with the metallic interconnect structure does not overlap the portion of the first metallic layer that is in contact with the metallic interconnect structure in a stacking direction of the semiconductor device.

7. The method of claim 1, wherein the metallic interconnect structure is formed adjacent to the portion of the second metallic layer in a direction perpendicular to a stacking direction of the semiconductor device.

8. The method of claim 1, the method further comprising:
    forming an organic planarizing layer on the second capping layer;
    forming a hard mask layer on the organic planarizing layer;
    performing lithography to form a pattern on the hard mask layer;
    etching the hard mask layer based at least in part on the pattern;
    etching the organic planarizing layer based at least in part on the pattern etched into the hard mask layer; and
    wherein etching the channel in the second capping layer, second dielectric layer, and first capping layer comprises etching the channel based at least in part on the pattern etched into the organic planarizing layer.

9. The method of claim 1, wherein the first metallization layer is formed on a middle-of-line structure of the semiconductor device.

10. A semiconductor device comprising:
    a first metallization layer comprising a first dielectric layer, a first metallic layer disposed in the first dielectric layer and a first capping layer disposed on and in contact with the first dielectric layer and the first metallic layer;
    a second metallization layer comprising a second dielectric layer, a second metallic layer disposed in the second dielectric layer and a second capping layer disposed on and in contact with the second dielectric layer and the second metallic layer, the second capping layer being disposed on an opposite side of the second dielectric layer from the first metallization layer; and
    a metallic interconnect structure disposed in contact with a portion of the first metallic layer, a portion of the second metallic layer, and a portion of the second capping layer.

11. The semiconductor device of claim 10, wherein the metallic interconnect structure extends from the portion of the first metallic layer to the second capping layer.

12. The semiconductor device of claim 10, further comprising a second metallic interconnect structure disposed in contact with a second portion of the first metallic layer and spaced apart from the second metallic layer by at least a portion of the second dielectric layer.

13. The semiconductor device of claim 12, wherein the second metallic interconnect structure extends from the second portion of the first metallic layer to the second capping layer.

14. The semiconductor device of claim 13, wherein the second metallic interconnect structure is configured to electrically connect the first metallic layer with a third metallic layer of a third metallization layer disposed on the second metallization layer.

15. The semiconductor device of claim 10, wherein the portion of the second metallic layer that is in contact with the metallic interconnect structure does not overlap the portion of the first metallic layer that is in contact with the metallic interconnect structure in a stacking direction of the semiconductor device.

16. The semiconductor device of claim 10, wherein the metallic interconnect structure is disposed adjacent to the portion of the second metallic layer in a direction perpendicular to a stacking direction of the semiconductor device.

17. The semiconductor device of claim 10, wherein the first metallization layer is disposed on a middle-of-line structure of the semiconductor device.

18. A method for fabricating a metallic interconnect of a semiconductor device, comprising:
    forming a middle-of-line layer of the semiconductor device, the middle of line layer comprising at least one metallic contact and a first capping layer formed over the at least one metallic contact;
    forming a metallization layer of the semiconductor device, the metallizatioon layer comprising a dielectric layer, a metallic layer formed in the dielectric layer and a second capping layer formed on the dielectric layer and the metallic layer;
    etching a channel in the second capping layer, dielectric layer, and first capping layer, the channel exposing a portion of the metallic contact and a portion of the metallic layer; and forming a metallic interconnect structure in the channel, the metallic interconnect structure being formed in contact with the exposed portion of the metallic contact and the exposed portion of the metallic layer;
    planarizing the metallic interconnect structure and the second capping layer to a surface of the metallic layer, the planarizing removing the second capping layer; and
    forming a third capping layer over the dielectric layer, metallic layer, and metallic interconnect structure.

19. The method device of claim 18, wherein the portion of the metallic layer that is in contact with the metallic interconnect structure does not overlap the portion of the metallic contact that is in contact with the metallic interconnect structure in a stacking direction of the semiconductor device.

20. The method of claim 18, further comprising:
    etching a second channel in the second capping layer, dielectric layer, and first capping layer, the second channel exposing a second portion of the metallic contact and being spaced apart from the metallic layer by at least a portion of the dielectric layer; and
    forming a second metallic interconnect structure in the second channel, the second metallic interconnect structure being formed in contact with the second portion of the metallic contact.

* * * * *